United States Patent [19]

Ogita

[11] 4,228,540
[45] Oct. 14, 1980

[54] RADIO RECEIVER
[75] Inventor: Minoru Ogita, Hamamatsu, Japan
[73] Assignee: Nippon Gakki Seizo Kabushiki Kaisha, Hamamatsu, Japan
[21] Appl. No.: 883,965
[22] Filed: Mar. 6, 1978
[30] Foreign Application Priority Data
Mar. 11, 1977 [JP] Japan .............................. 52/29347[U]
[51] Int. Cl.³ .............................................. H04B 1/26
[52] U.S. Cl. ................................ 455/158; 358/192.1; 455/260
[58] Field of Search ................. 325/455, 419, 67, 363; 331/64; 324/78 R, 78 D, 79 R, 79 D; 358/192; 179/15 BP

[56] References Cited
U.S. PATENT DOCUMENTS

| | | | |
|---|---|---|---|
| 3,163,823 | 12/1964 | Kellis et al. | 324/79 D |
| 3,244,983 | 4/1966 | Ertman | 324/79 D X |
| 3,742,353 | 6/1973 | Parisi | 324/79 D |
| 3,938,048 | 2/1976 | Elliott | 325/455 |
| 4,052,722 | 10/1977 | Millard | 324/79 D X |
| 4,070,618 | 1/1978 | Thomas | 324/79 D X |

OTHER PUBLICATIONS

Lew, W. M. Jr., "A Primer on Phase-Locked Loops"; Electronic Design, Jul. 20, 1964, vol. 12. No. 15, pp. 56–60.

*Primary Examiner*—Marc E. Bookbinder
*Attorney, Agent, or Firm*—Jordan and Hamburg

[57] ABSTRACT

A radio receiver includes a phase-locked loop which is locked with the tuned frequency of a broadcast radio wave applied thereto, so that the output of the phase-locked loop is displayed by a display unit to display the tuned frequency. The displayed frequency is free from possible deviation of a local oscillation frequency from the tuned frequency.

7 Claims, 3 Drawing Figures

RADIO RECEIVER

BACKGROUND OF THE INVENTION

This invention relates to radio receivers having a circuit for displaying a received radio wave frequency.

There are two ways for displaying a received frequency: one is an analog display, and the other is a digital display. The latter is more advantageous than the former, because with the digital display a value displayed can be directly read so that the frequency value reading is carried out accurately and quickly.

In a conventional circuit for digitally displaying a received frequency in a radio receiver performing the superheterodyne reception, the oscillation output of the local oscillator is applied to a counter in which a value corresponding to the intermediate frequency is preset so as to be added to or subtracted from the received-frequency value, and the count result is digitally displayed.

However, with such a digital display circuit, the frequency displayed is not the frequency of the actually received broadcast radio wave, because the displayed frequency is obtained by correcting the local oscillation frequency with the intermediate frequency component. Accordingly, the conventional digital display circuit suffers from a disadvantage that if the radio receiver is not completely tuned to the frequency of the broadcast radio wave, it is not accurately displayed. For instance, when it is intended to receive a broadcast radio wave of 1000 KHz, it can be received if it is within the tuning range of the radio receiver determined by the bandwidth of its tuning circuit. However, it should be noted that the displayed frequency is varied within the aforementioned tuning range in correspondence to the change of the oscillation frequency of the local oscillator. In other words, even if the radio receiver is somewhat detuned, the broadcast radio wave frequency can be received by catching it within the tuning band width thereof. However, since the frequency display is effected in accordance with the local oscillation frequency but not with the received frequency, the frequency displayed thereby is different from the received frequency if the radio receiver is not accurately tuned thereto. Furthermore, if the output of the local oscillator drifts, correct frequency display is not carried out.

SUMMARY OF THE INVENTION

Accordingly, an object of this invention is to provide a radio receiver having a frequency display circuit by means of which a received frequency can be accurately displayed.

Another object of the invention is to provide a radio receiver provided with a received frequency display means which is not affected by drift in the local oscillator.

The foregoing and other objects of the invention have been achieved by the provision of a radio receiver comprising a phase-locked loop receiving, as its input, a received radio wave signal, display means for displaying the oscillation frequency of the phase-locked loop, means for varying the free-running frequency of the phase-locked loop, and means for varying the tuning frequency of the radio receiver, the means for varying the free-running frequency of the phase-locked loop and the means for varying the tuning frequency of the radio receiver being operated in association with each other, the phase-locked loop being phase-locked with said radio wave signal to display a received radio wave frequency on the display means.

The nature, principle and utility of this invention will become more apparent from the following detailed description and the appended claims when read in conjunction with the accompanying drawings, in which like parts are designated by like reference numerals or characters.

DETAILED DESCRIPTION OF THE PREFERRED EMBODIMENTS

Figure 1:
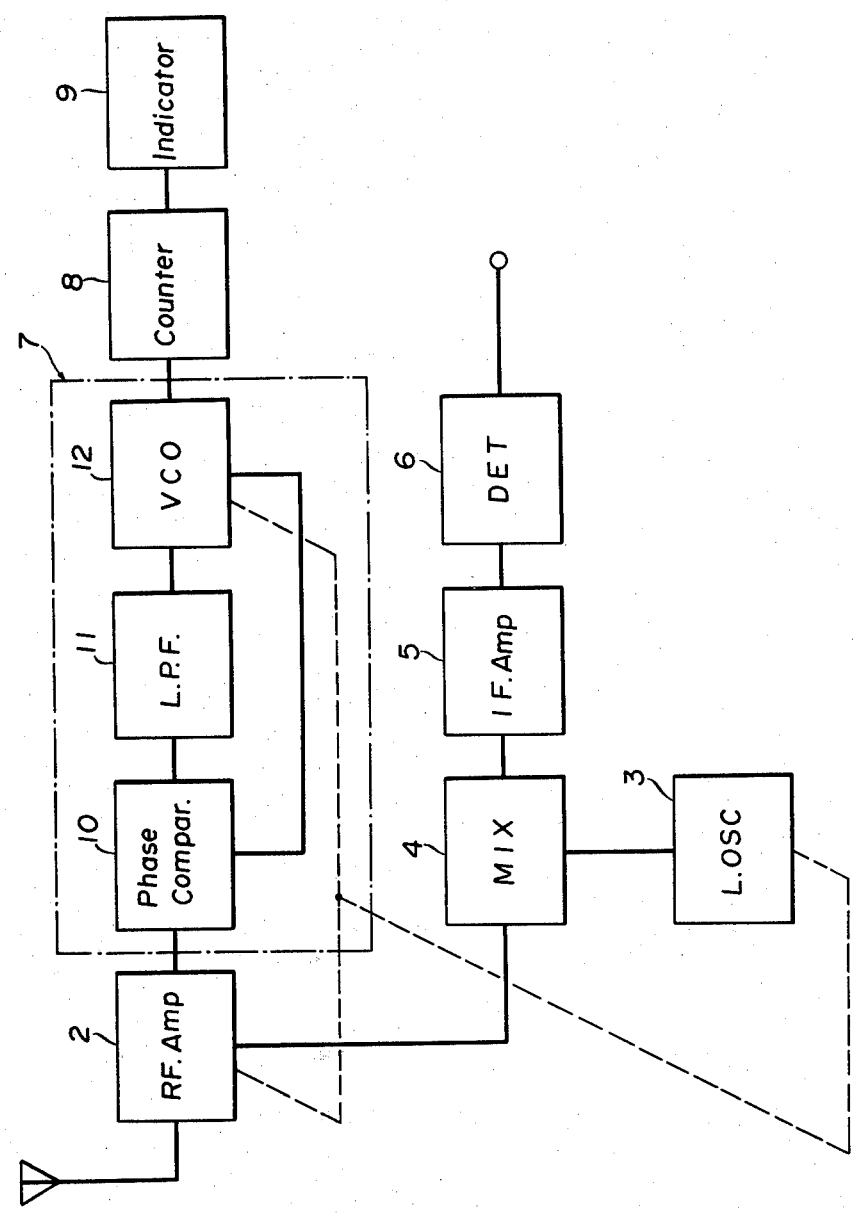
FIG. 1 is a block diagram illustrating essential components of a radio receiver according to this invention.

One preferred embodiment of this invention is shown in FIG. 1, in which the technical concept of the invention is applied to an AM radio receiver. Referring to FIG. 1, the receiver comprises a high-frequency amplifying stage 2, a local oscillator 3, a mixer 4, an intermediate-frequency amplifier 5 and a detector 6. The high-frequency amplifying stage 2 includes an input circuit serving as an tuning circuit. The input of a phase-locked loop 7 is connected to the output of the high-frequency amplifying stage 2, while a counter 8 is connected to the output of the phase-locked loop 7. Connected to the output of the counter 8 is a display section 9 including a suitable digital display unit.

The phase-locked loop 7 comprises a phase comparator 10, a lowpass filter 11, and a voltage-controlled oscillator 12. The input of the phase comparator 10 is connected to the output of the high-frequency amplifying stage 2. The output of the voltage-controlled oscillator 12 is connected to the input of the counter 8. The voltage-controlled oscillator 12 in the phase-locked loop 7 includes an element for varying the free-running frequency thereof. This element may be a variable capacitor, a varactor diode or a variable resistor. The tuning circuit in the high-frequency amplifying stage 2 includes an element (similar to the above-mentioned element in the voltage-controlled oscillator 12) for varying the tuning frequency of the tuning circuit. These two elements in the voltage-controlled oscillator 12 and the high-frequency amplifying stage 2 are interlocked with each other for simultaneous operation. Needless to say, the aforementioned element in the tuning circuit is further interlocked with an element in the local oscillator 3 for varying the local oscillation frequency. Accordingly, the free-running frequency of the voltage-controlled oscillator 12 is varied substantially in coincidence with the tuning frequency with the tuning operation of the high-frequency amplifying stage 2. Furthermore, in the phase-locked loop 7, the tracking range is so selected as to be within the band width of the tuning circuit at all times.

In operation, when the receiver is tuned to a broadcast radio wave signal applied thereto through the antenna, the radio wave signal is tuned and amplified by the high-frequency amplifying stage 2, subjected to frequency conversion in the mixer 4, amplified by the intermediate frequency amplifier 5, and detected as an audio output by the detector 6. On the other hand, the radio wave signal tuned and amplified by the high-frequency amplifying stage 2 is applied to the phase comparator 10 in the phase-locked loop 7. Since the input signal thus applied is within the tracking range, the phase-locked loop 7 locks with the input signal, and therefore an output having the same frequency as that of the tuned radio wave signal is provided at the output terminal of the voltage-controlled oscillator 12. This output is applied to the counter 8, where it is counted, and finally the frequency display is effected by the display section 9. As long as the phase-locked loop 7 locks with the input signal, or as long as the radio wave signal is caught within the band width of the tuning circuit, the frequency display of the input signal is carried out by the display section 9. Accordingly, the audio output of the broadcast radio wave signal is obtained within the band width of the tuning circuit, and the exact carrier wave frequency of the received broadcast is displayed by the display section 9 without contradiction to the audio output.

In the above-described embodiment, the input to the phase-locked loop is obtained from the high-frequency amplifying stage 2; however, it should be noted that the invention is not limited thereto or thereby. That is, in this case, all that is necessary is to apply the input signal at a predetermined level to the phase comparator 10 so that the latter is operated. For instance, the input signal path of the phase-locked loop 7 may be provided separately from the signal path shown in FIG. 1.

Figure 2:
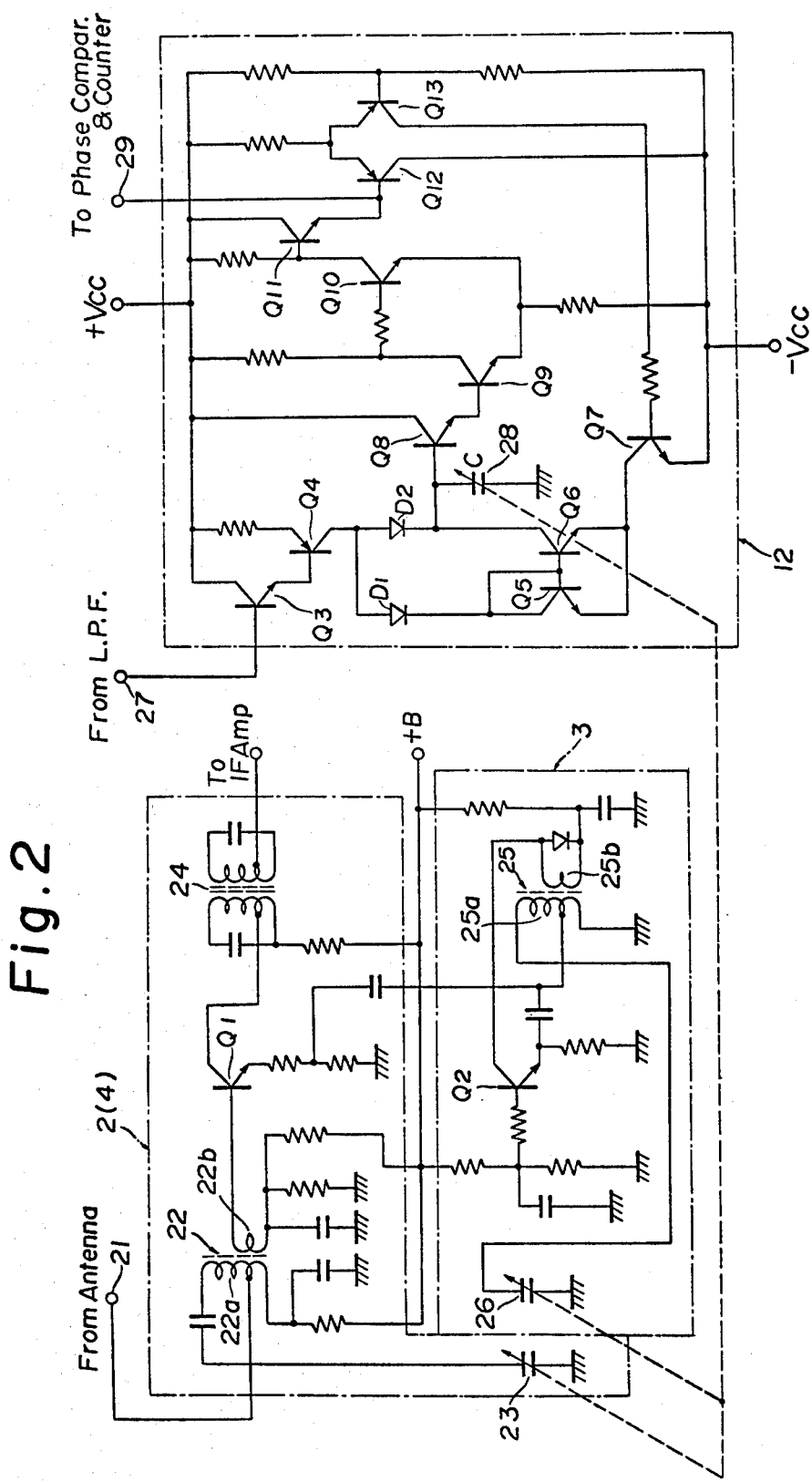
FIG. 2 is a schematic circuit diagram showing a high-frequency amplifier, a local oscillator, a mixer, and a voltage-controlled oscillator in a phase-locked loop which are employed in the radio receiver shown in FIG. 1.

FIG. 2 shows an example of the concrete circuits of the high-frequency amplifying stage 2, the local oscillator 3, the mixer 4, and the voltage-controlled oscillator 12 in the phase-locked loop 7 shown in FIG. 1.

In the high-frequency amplifying stage 2 and the mixer 4, a radio wave signal is applied through the antenna (not shown) and an input terminal 21 to the tuning circuit made up of the primary coil 22a of a high-frequency coil 22 and a variable capacitor 23, where it is suitably selected. The input signal thus selected is applied through the secondary coil 22b of the high-frequency coil 22 to the base of a high-frequency amplifying and mixing transistor $Q_1$. In this transistor $Q_1$, the signal is mixed with the local oscillation output of the local oscillator 3 applied to the emitter of the transistor $Q_1$, as a result of which it is converted into an intermediate-frequency signal which is applied through the collector of the transistor $Q_1$ to an intermediate-frequency transformer 24.

In the local oscillator 3, a tuning circuit made up of the primary coil 25a of an oscillation coil 25 and a variable capacitor 26 is connected to the emitter of a transistor $Q_2$, the collector of which is connected to the secondary coil 25b of the oscillation coil 25. An oscillation output developed across the primary coil 25a of the oscillation coil 25 is supplied to the emitter of the transistor $Q_2$.

The voltage-controlled oscillator 12 of the phase-locked loop 7 is made up of an integration circuit and a Schmitt trigger circuit. The signal from the aforementioned low-pass filter 11 is applied to a voltage-controlled current source having transistors $Q_3$ and $Q_4$ through an input terminal 27, so that the collector current of the transistor $Q_4$ is linearly varied in response to the signal voltage. When a transistor $Q_7$ is in "off" state (being rendered non-conductive), the current of the transistor $Q_4$ charges a variable capacitor 28 through a diode $D_2$. When the terminal voltage of the capacitor 28 reaches a predetermined value, transistors $Q_8$ and $Q_9$ are rendered conductive (on), a transistor $Q_{10}$ is rendered non-conductive (off), a transistor $Q_{11}$ is rendered conductive, a transistor $Q_{12}$ is rendered non-conductive, a transistor $Q_{13}$ is rendered conductive, and the transistor $Q_7$ is rendered conductive. When the transistor $Q_7$ is rendered conductive, the collector current of the transistor $Q_4$ is allowed to flow through a diode $D_1$ and a transistor $Q_5$, whereupon the diode $D_2$ is reversely biased. Accordingly, the variable capacitor 28 is discharged through a transistor $Q_6$. When the terminal voltage of the variable capacitor 28 is decreased to a predetermined value, the transistors $Q_8$ and $Q_9$ are therefore rendered non-conductive. The above-described operations are repeatedly carried out, as a result of which a square wave oscillation output is obtained at the emitter of the transistor $Q_{11}$, and is applied through an output terminal 29 to the above-described phase comparator 10.

The variable capacitors 23, 26 and 28 of the high-frequency amplifying stage 2, the local oscillator 3 and the voltage-controlled oscillator 12 are interlocked with one another and operated as one unit by operating an operating knob (not shown). Accordingly, the tuning frequency of the high-frequency amplifying stage 2 determined by the capacitance of the variable capacitor 23, the oscillation frequency of the local oscillator 3 determined by the capacitance of the variable capacitor 26, and the free-running frequency (substantially coincident with the tuning frequency of the high-frequency amplifying stage 2) of the voltage-controlled oscillator 12 determined by the capacitance of the variable capacitor 28, are varied simultaneously and equally. Therefore, if the tuning operation of the high-frequency amplifying stage 2 is carried out by operating the aforementioned operating knob, the free-running frequency of the voltage-controlled oscillator 12 can be varied substantially in coincidence with the tuning frequency mentioned above.

In the arrangement in FIG. 2, the variable capacitor 23 of the high-frequency amplifying stage 2 or the variable capacitor 26 of the local oscillator 3 should be different from the variable capacitor 28 of the voltage-controlled oscillator 12 in capacitance variation characteristic with respect to rotation angle of a capacitance adjusting member in each capacitor.

Figure 3:
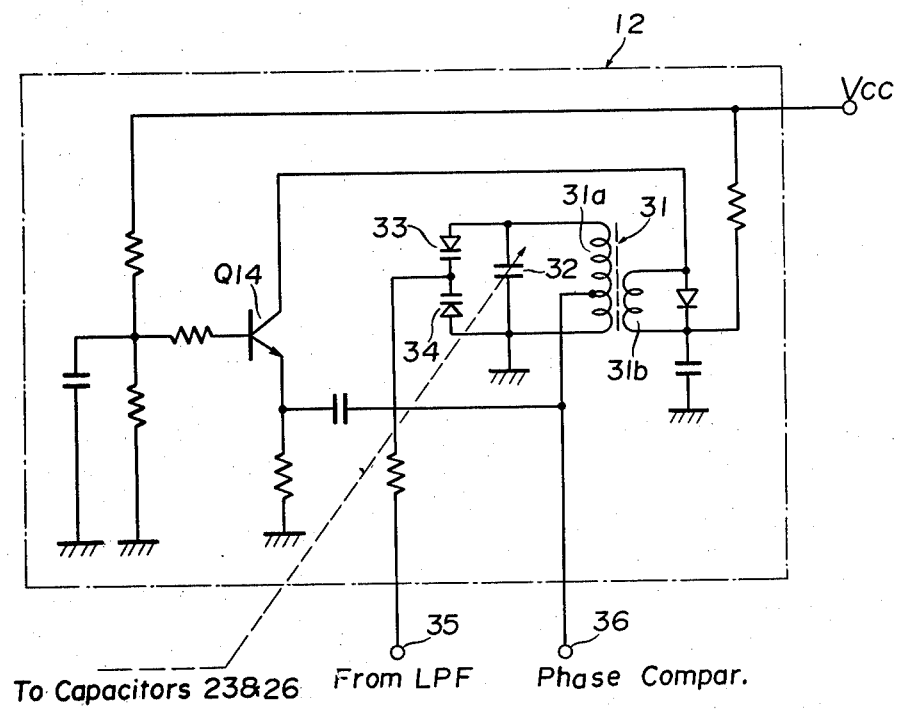
FIG. 3 is a schematic circuit diagram showing another example of the voltage-controlled oscillator to be used in the receiver shown in FIG. 1.

Shown in FIG. 3 is another example of the voltage-controlled oscillator 12. In this example, the voltage-controlled oscillator 12 is employed in combination with the high-frequency amplifying stage 2 and the local oscillator 3 similarly as in the above-described case, and yet the variable capacitor of the voltage-controlled oscillator 12 may be equal in characteristic to the variable capacitors 23 and 26 of the high-frequency amplifying stage 2 and the local oscillator 3.

The voltage-controlled oscillator 12 shown in FIG. 3 is an L-C oscillator in which a tuning circuit made up of the primary coil 31a of an oscillation coil 31, a variable capacitor 32 and varactor diodes 33 and 34 is connected to the emitter of a transistor $Q_{14}$. Furthermore, the secondary coil 31b of the oscillation coil 31 is connected to the collector of the transistor $Q_{14}$. The signal from the above-described low-pass filter 11 is applied through an input terminal 35 to the connection point of the varactor diodes 33 and 34, and an oscillation output provided at the center tap of the primary coil 31a is supplied through an output terminal 36 to the above-described phase comparator 10. In this voltage-controlled oscillator 10, as the L-C oscillator is employed, the variable capacitor 32 can be equal in characteristic (or capacitance variation characteristic with respect to rotation angle) to the variable capacitor 23 or 26 shown in FIG. 3.

As is apparent from the above description, the elements in the voltage-controlled oscillator, tuning circuit and local oscillator for varying the respective frequencies are preferably electric parts of the same kind to make easier the mechanical design interlocking the three elements.

What is claimed is:

1. In a superheterodyne radio receiver having a radio frequency stage for receiving radio wave signals, an oscillator, a mixer stage coupled to said radio frequency stage and oscillator to provide intermediate frequency signals, and detector means for demodulating said intermediate frequency signals, the improvement comprising:

a tuning circuit coupled to said radio frequency stage and responsive to a radio wave signal applied to said receiver and producing a signal of a tuned frequency equal to the frequency of said radio wave signal; a phase-locked loop circuit responsive to said tuned-frequency signal and producing an output signal having a frequency in accordance with said tuned frequency; means for varying a free-running frequency of said phase-locked loop circuit;

means for varying the tuning frequency of said tuning circuit and interlocked with said free-running frequency varying means; and means for displaying the value of said output signal frequency of said phase-locked loop circuit.

2. A radio receiver as claimed in claim 1, wherein said radio frequency stage comprises a high-frequency amplifier circuit connected to said tuning circuit and producing an output signal supplied to said phase-locked loop circuit.

3. A radio receiver as claimed in claim 1, in which said phase-locked loop has a tracking range which is within a frequency range corresponding to a band width of the tuning circuit.

4. A radio receiver as claimed in claim 1, in which each of said free-running frequency varying means and said tuning frequency varying means comprises a variable capacitor.

5. A radio receiver as claimed in claim 1, in which said display means comprises a counter circuit connected to said phase-locked loop circuit, and a digital display circuit connected to said counter circuit.

6. A superheterodyne radio receiver comprising:
   (a) an antenna;
   (b) a tuning circuit responsive to a radio wave signal applied to said receiver through the antenna for providing a high-frequency signal of a tuning frequency equal to that of the radio wave signal and including means for varying the tuning frequency of said tuning circuit;
   (c) a local oscillator for producing a local oscillation frequency signal and including means for varying an oscillation frequency of said local oscillator; a mixer circuit connected to receive said high-frequency signal and said local oscillation frequency signal for converting said high-frequency signal into an intermediate-frequency signal;
   (d) a detector circuit for detecting said intermediate-frequency signal to produce an audio signal;
   (e) a phase-locked loop circuit connected to receive said high-frequency signal and including a voltage-controlled oscillator for producing an oscillatory output signal, a phase comparator responsive to said high-frequency signal and said output signal of said voltage-controlled oscillator to produce a signal representing a phase difference between both the signals, and a low-pass filter responsive to said phase difference signal for producing a control signal which is applied to said voltage-controlled oscillator for controlling the frequency of said output signal, said voltage-controlled oscillator including means for varying said free-running frequency, all of said tuning frequency varying means, said local oscillation frequency varying means and said free-running frequency varying means being interlocked with one another; and
   (f) an indicator coupled to said voltage-controlled oscillator for indicating the frequency of the output signal of the voltage-controlled oscillator.

7. The radio receiver of claim 6, wherein said indicator comprises a counter coupled to receive the output of said voltage-controlled oscillator, and a digital display for digitally indicating the count of said counter.

* * * * *